United States Patent [19]

Tanaka et al.

[11] 4,403,166

[45] Sep. 6, 1983

[54] PIEZOELECTRIC RELAY WITH OPPOSITELY BENDING BIMORPHS

[75] Inventors: Fumio Tanaka, Hirakata; Kenroku Tani, Katano; Hideo Mifune, Hirakata, all of Japan

[73] Assignee: Matsushita Electric Industrial Co., Ltd., Osaka, Japan

[21] Appl. No.: 413,338

[22] PCT Filed: Dec. 16, 1981

[86] PCT No.: PCT/JP81/00389

§ 371 Date: Aug. 19, 1982

§ 102(e) Date: Aug. 19, 1982

[87] PCT Pub. No.: WO82/02282

PCT Pub. Date: Jul. 8, 1982

[30] Foreign Application Priority Data

Dec. 19, 1980 [JP] Japan ............................... 55-183730

[51] Int. Cl.[3] ............................................ H01L 41/08

[52] U.S. Cl. ................................... 310/332; 200/181; 200/246; 200/283

[58] Field of Search ....................... 200/181, 283, 246; 310/332, 330, 331, 317

[56] References Cited

U.S. PATENT DOCUMENTS

| | | | |
|---|---|---|---|
| 2,166,763 | 7/1939 | Mason | 310/317 |
| 2,182,340 | 12/1939 | Hearn | 310/317 |
| 2,471,967 | 5/1949 | Mason | 200/181 |
| 4,093,883 | 6/1978 | Yamamoto | 310/332 |

*Primary Examiner*—William M. Shoop

*Assistant Examiner*—D. L. Rebsch

*Attorney, Agent, or Firm*—Burgess, Ryan & Wayne

[57] ABSTRACT

The invention relates to a piezoelectric relay in which a bimorph is used as a flexible element. First, second and third relay contacts (14), (14') and (14") are disposed coplanar with the third relay contact sandwiched between the first and second relay contacts. First and second flexible members (11) and (11'), each of which is supported as a cantilever, are displaced in directions opposite to each other when an electric field is applied to one. The first flexible member (11) displaces the first and second relay contacts (14) and (14'), and the second flexible member (11') displaces the third relay contact (14"). Thus, the first and third relay contacts (14) and (14") and the second and the third relay contacts (14') and (14") are turned on or off in response to the different polarities of the applied electric field.

3 Claims, 5 Drawing Figures

PIEZOELECTRIC RELAY WITH OPPOSITELY BENDING BIMORPHS

TECHNICAL FIELD

The present invention relates to a piezoelectric relay using as a flexible element a piezoelectric porcelain plate having a bimorph structure.

BACKGROUND ART

FIG. 1 shows a fundamental arrangement of a flexible element as a principal element of the piezoelectric relay, and the mode of operation thereof. Referring to FIG. 1, reference numerals 1 and 1' are piezoelectric porcelain plates which are adhered to each other to constitute a flexible member 2 having a bimorph structure. One end of the flexible member 2 is supported as a cantilever by a support portion 3, and the other end thereof has a relay contact 5 through an insulating member 4. The piezoelectric porcelain plates 1 and 1' are respectively polarized in such a manner that electric fields applied to the piezoelectric porcelain plates 1 and 1' oppose to each other when a voltage is applied thereacross through input electrode lead wires 6 and 6'. Therefore, when the piezoelectric porcelain plate 1 (or 1') is straight, the piezoelectric porcelain plate 1' (or 1) is curved. As a result, the flexible member 2 is displaced as indicated by the broken lines.

In general, since flexible elements have a small displacement, two flexible members are used and displaced in opposite directions so as to double the total displacement, as described in U.S. Pat. No. 4,093,883. Furthermore, since a piezoelectric relay is generally turned on or off when input power is applied thereto, a combination of flexible members which are set from OFF to ON and from ON to OFF, respectively, is required for switching a circuit when power is supplied to the piezoelectric relay.

Known piezoelectric relays which provide a switching operation are described in U.S. Pat. No. 2,471,967 and U.S. Pat. No. 2,835,761. In these piezoelectric relays, the stroke of the movable contact is increased utilizing the principle of the "lever". However, the above-mentioned piezoelectric relays have drawbacks in that their structure is complex and pressure acting on the contact is decreased due to the principle of the "lever". Further, piezoelectric relays which do not utilize the principle of the "lever" are described in U.S. Pat. No. 2,166,763 and U.S. Pat. No. 2,182,340. In these relays, however, opposing contacts are fixed, so that a complex mechanism is required to control a small stroke. Further, the stroke must be increased by increasing drive input electric field.

DISCLOSURE OF INVENTION

It is an object of the present invention to provide a simple and multifunctional piezoelectric relay having first and second flexible members, each of which supports piezoelectric porcelain plates of a bimorph structure as a cantilever, and first, second and third relay contacts which are respectively electrically independent of each other so as to displace said first and second flexible members in opposite directions upon application of an electric field, wherein said first and second relay contacts are simultaneously displaced in the same direction within a single plane upon displacement of said first flexible member, and said third relay contact is displaced within the plane of displacement of said first and second relay contacts in the direction opposite to the direction of displacement of said first and second relay contacts, so that a switching operation of a circuit by a low drive input can be performed without utilizing the principle of the "lever", and multifunctionality is provided in accordance with the different polarities of the applied electric field.

BEST MODE OF CARRYING OUT THE INVENTION

Figure 1:
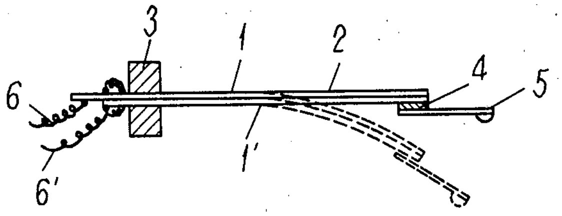
FIG. 1 is a view for explaining the mode of operation of a basic piezoelectric relay.

A piezoelectric relay according to an embodiment of the present invention will be described with reference to FIG. 2. Reference numerals 11 and 11' denote first and second flexible members which have bimorph structures and comprise adhered piezoelectric porcelain plates 11*a* and 11*b*, and 11'*a* and 11'*b*, respectively. One end of each of the first and second flexible members 11 and 11' is supported as a cantilever by a support portion 12. The piezoelectric porcelain plates 11*a* and 11*b*, and 11'*a* and 11'*b* are respectively polarized so that electric fields are applied in opposite directions on the piezoelectric porcelain plates 11*a* and 11*b*, and 11'*a* and 11'*b*, respectively, upon application of a voltage.

First and second relay contacts 14 and 14' are disposed at the other end of the first flexible element 11 through insulating members 13 and 13', respectively. A third relay contact 14" is disposed at the other end of the second flexible element 11' through an insulating member 13". The first and second relay contacts 14 and 14' are coplanar with the third relay 14". Reference numerals 15 and 15' denote input electrode lead wires through which the positive and negative poles of the electric field are connected to the first and second flexible members 11 and 11', respectively. The input electrode lead wires 15 are connected to electrodes (not shown) on the adhered surfaces of the first and second flexible members 11 and 11' so as to equalize the potentials at the electrodes. The input electrode lead wires 15' are connected to two outer electrodes (not shown) of the first and second flexible elements 11 and 11' so as to equalize the potentials of the two outer electrodes.

Figure 2:
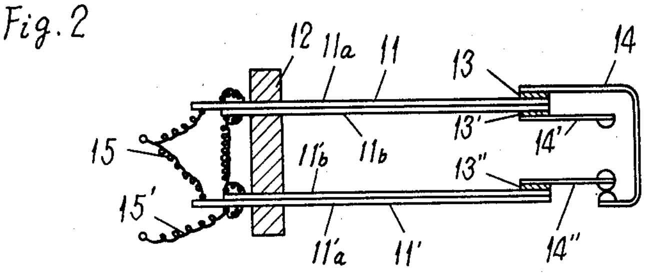
FIG. 2 is a view for explaining the mode of operation of a piezoelectric relay according to an embodiment of the present invention.

Assume that the first and second flexible elements 11 and 11' are displaced toward each other upon application of a voltage across the input electrode lead wires 15 and 15', so that the second and third relay contacts 14' and 14" contact with each other, and that upon deenergization the first and second flexible members 11 and 11' return to their initial positions so that the first and third relay contacts 14 and 14" contact each other as shown in FIG. 2. Upon energization, relay outputs from output lead wires (not shown) connected respectively to the first, second and third relay contacts 14, 14' and 14" are ON between the second and third relay contacts 14' and 14" and are OFF between the first and third relay contacts 14 and 14". When power is OFF, output is OFF between the second and third relay contacts 14' and 14" and output is ON between the first and third relay contacts 14 and 14". Thus, the switching operation is performed.

Figure 3:
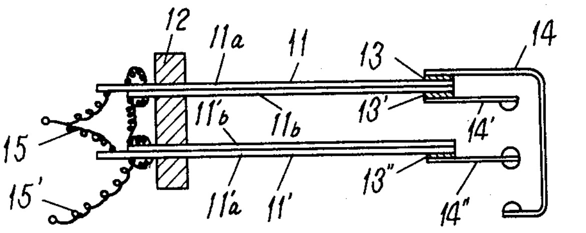
FIG. 3 is a view for explaining the mode of operation of a piezoelectric relay according to another embodiment of the present invention.
Figure 4:
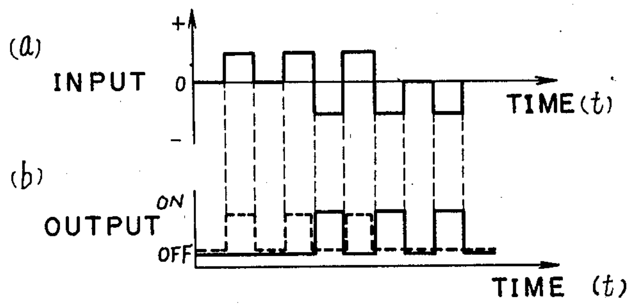
FIGS. 4*a* and 4*b* are timing charts of input and output signals of the piezoelectric relay shown in FIG. 3.

As shown in FIG. 3, when power is OFF, the first and third relay contacts 14 and 14" and the second and third contacts 14' and 14" are respectively spaced apart from each other. If a potential at the input electrode lead wires 15 is higher than that at the input electrode lead wires 15', the first and second flexible members 11 and 11' are displaced toward each other, so that the second relay contact 14' is in contact with the third relay contact 14". However, when the potential at the input electrode lead wires 15 is lower than that at the input electrode lead wires 15', the first flexible member 11 is displaced away from the second flexible member 11'. Therefore, the first relay contact 14 comes into contact with the third relay contact 14". If the piezoelectric relay is arranged as described above, the relay output is switched when the input voltage (voltage at the lead wires 15 with reference to that at the lead wires 15') is switched as shown in FIG. 4*a* (voltages between the first and third relay contacts 14 and 14" and between the second and third relay contacts 14' and 14" are respectively indicated by the solid line and the broken line). If the input voltage is ON or OFF for a given polarity, the output is ON or OFF between corresponding relay contacts.

INDUSTRIAL APPLICABILITY

As described above, according to the low power consumption voltage-driven piezoelectric relay of the present invention, a circuit switching operation can be performed by a relay output obtained in response to a low drive input. Further, multifunctionality can be provided in accordance with the different polarities of the applied electric field. Further, the piezoelectric relay according to the present invention is simple in construction and low in cost.

We claim:

1. A piezoelectric relay comprising first and second flexible members each of which supports piezoelectric porcelain plates of a bimorph structure, and relay contacts which are turned on/off by a displacement of said first and second flexible members, characterized in that said relay contacts comprise first, second and third relay contacts which are electrically independent of each other and which are displaced in opposite directions upon application of an electric field to said first and second flexible members, such that said first and second relay contacts are displaced in the same direction within a single plane upon a displacement of said first flexible member, and said third relay contact is displaced in a direction opposite to said same direction in the plane of displacement of said first and second relay contacts upon a displacement of said second flexible members.

2. A piezoelectric relay according to claim 1, characterized in that said second relay contact comes into contact with said third relay contact and said first relay contact is spaced apart from said third relay contact when the electric field is applied to said first and second flexible members, whereas said first relay contact comes into contact with said third relay contact and said second relay contact is spaced apart from said third relay contact when the electric field is not applied to said first and second flexible members.

3. A piezoelectric relay according to claim 1, characterized in that all of said first, second and third relay contacts are spaced apart from each other when the electric field is not applied; said second relay contact comes into contact with said third relay contact and said first relay contact is spaced apart from said third relay contact when said first and second flexible members are displaced toward each other, whereas said first relay contact comes into contact with said third relay contact and second relay contact is spaced apart from said third relay contact when said first and second flexible members are spaced apart from each other.

* * * * *